United States Patent
Wei

(10) Patent No.: US 9,847,445 B2
(45) Date of Patent: Dec. 19, 2017

(54) LED THIN-FILM DEVICE PARTIAL SINGULATION PRIOR TO SUBSTRATE THINNING OR REMOVAL

(71) Applicant: KONINKLIJKE PHILIPS N.V., Eindhoven (NL)

(72) Inventor: Frank Wei, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/389,780

(22) PCT Filed: Mar. 29, 2013

(86) PCT No.: PCT/IB2013/052534
§ 371 (c)(1),
(2) Date: Oct. 1, 2014

(87) PCT Pub. No.: WO2013/150427
PCT Pub. Date: Oct. 10, 2013

(65) Prior Publication Data
US 2015/0064808 A1 Mar. 5, 2015

Related U.S. Application Data

(60) Provisional application No. 61/620,480, filed on Apr. 5, 2012.

(51) Int. Cl.
*H01L 33/00* (2010.01)
*H01L 33/50* (2010.01)
*H01L 33/48* (2010.01)

(52) U.S. Cl.
CPC ...... *H01L 33/0095* (2013.01); *H01L 33/0079* (2013.01); *H01L 33/507* (2013.01);
(Continued)

(58) Field of Classification Search
CPC ............... H01L 33/005; H01L 33/0079; H01L 33/0095; H01L 33/52–33/56;
(Continued)

(56) References Cited

U.S. PATENT DOCUMENTS 5,882,956 A * 3/1999 Umehara ............... H01L 21/304
257/E21.237
6,368,893 B1 * 4/2002 Tani ........................ H01L 21/56
257/E21.502
(Continued)

FOREIGN PATENT DOCUMENTS

DE 102008010512 A1 8/2009
WO 2007049187 A1 5/2007

*Primary Examiner* — Maliheh Malek

(57) ABSTRACT

LED dies are partially singulated while on an unthinned depth growth substrate. Slots are made through the streets separating the LED dies, but not through the growth substrate, leaving the now separated LED dies on the growth substrate. A secondary support is attached to the LED dies on the opposite surface from the growth substrate, and the growth substrate is thinned or removed, leaving the LED dies on the secondary support. Because the LED dies are separated while on the unthinned growth substrate, the likelihood of distortion before slicing is virtually eliminated, and the width of the streets between the LED dies may be correspondingly reduced.

9 Claims, 2 Drawing Sheets

(52) U.S. Cl.
CPC ............ *H01L 2933/0033* (2013.01); *H01L 2933/0041* (2013.01)

(58) Field of Classification Search
CPC ..... H01L 27/15; H01L 27/153; H01L 27/156; H01L 21/78–21/7813
USPC .......... 438/25, 26, 28, 33, 34, 106, 110–114
See application file for complete search history.

(56) References Cited

U.S. PATENT DOCUMENTS

| | | | |
|---|---|---|---|
| 6,461,938 B2* | 10/2002 | Nakabayashi | H01L 21/3043 257/E21.238 |
| 6,465,329 B1* | 10/2002 | Glenn | 438/462 |
| 6,737,285 B2* | 5/2004 | Iketani | H01L 21/56 257/E21.502 |
| 6,780,733 B2* | 8/2004 | Chason et al. | 438/464 |
| 7,063,765 B2* | 6/2006 | Kudo | H01L 21/67132 156/258 |
| 7,291,509 B2* | 11/2007 | Hahn et al. | 438/33 |
| 7,718,449 B2 | 5/2010 | Gao et al. | |
| 7,955,955 B2* | 6/2011 | Lane et al. | 438/465 |
| 8,021,901 B2* | 9/2011 | Kim et al. | 438/22 |
| 8,071,429 B1* | 12/2011 | Qian et al. | 438/113 |
| 8,268,704 B2* | 9/2012 | Fujii et al. | 438/460 |
| 8,629,475 B2* | 1/2014 | Tischler | 257/98 |
| 8,759,125 B2* | 6/2014 | Tischler | 438/27 |
| 8,759,951 B2* | 6/2014 | Mitani | 257/623 |
| 8,916,403 B2* | 12/2014 | Gunther et al. | 438/33 |
| 8,932,891 B2* | 1/2015 | Yang et al. | 438/47 |
| 2003/0189215 A1* | 10/2003 | Lee et al. | 257/94 |
| 2004/0126911 A1* | 7/2004 | Kimura | G02F 1/13624 438/22 |
| 2005/0054121 A1* | 3/2005 | Handy | H01L 21/6835 438/3 |
| 2005/0130390 A1* | 6/2005 | Andrews et al. | 438/458 |
| 2005/0194605 A1* | 9/2005 | Shelton et al. | 257/99 |
| 2005/0227455 A1* | 10/2005 | Park et al. | 438/458 |
| 2005/0258350 A1* | 11/2005 | Van Arendonk | H01L 31/0203 250/239 |
| 2007/0212854 A1* | 9/2007 | Chu | H01L 33/0079 438/464 |
| 2008/0179611 A1* | 7/2008 | Chitnis et al. | 257/98 |
| 2009/0085045 A1* | 4/2009 | Marion | H01L 21/6835 257/79 |
| 2009/0093075 A1* | 4/2009 | Chu | H01L 33/0079 438/33 |
| 2010/0047939 A1* | 2/2010 | Kamei | H01L 33/0079 438/27 |
| 2010/0171215 A1* | 7/2010 | Fischer | H01L 21/561 257/734 |
| 2010/0186883 A1* | 7/2010 | Tomoda | 156/220 |
| 2010/0314633 A1* | 12/2010 | Donofrio et al. | 257/88 |
| 2010/0317132 A1* | 12/2010 | Rogers | H01L 25/0753 438/27 |
| 2011/0136271 A1* | 6/2011 | von Malm | H01L 33/0079 438/15 |
| 2011/0143501 A1* | 6/2011 | Oda | C08L 63/00 438/127 |
| 2011/0266560 A1 | 11/2011 | Yao et al. | |
| 2011/0266569 A1* | 11/2011 | Basin et al. | 257/98 |
| 2011/0284822 A1* | 11/2011 | Jung | H01L 33/505 257/13 |
| 2012/0218719 A1* | 8/2012 | Forrest | H01L 27/307 361/735 |
| 2012/0220063 A1* | 8/2012 | Seong | H01L 33/647 438/46 |
| 2012/0299147 A1* | 11/2012 | Mitani | 257/506 |
| 2012/0305957 A1* | 12/2012 | Gandhi | H01L 33/0079 257/98 |
| 2012/0314388 A1* | 12/2012 | Bower et al. | 361/760 |
| 2013/0048209 A1* | 2/2013 | Ooyabu | H01L 33/52 156/248 |
| 2013/0178006 A1* | 7/2013 | Kim | H01L 21/78 438/33 |
| 2013/0187178 A1* | 7/2013 | Tischler | 257/88 |
| 2013/0248918 A1* | 9/2013 | Miyachi et al. | 257/99 |
| 2013/0256711 A1* | 10/2013 | Joo | H01L 33/486 257/88 |
| 2013/0256739 A1* | 10/2013 | Matsuda et al. | 257/99 |
| 2014/0080287 A1* | 3/2014 | Zull | H01L 31/18 438/463 |
| 2014/0319560 A1* | 10/2014 | Tischler | 257/98 |

* cited by examiner

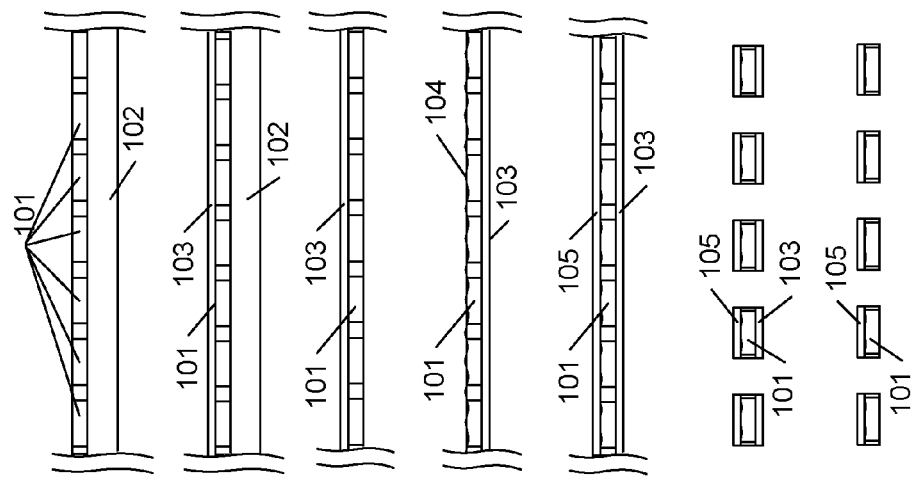
FIG. 1B
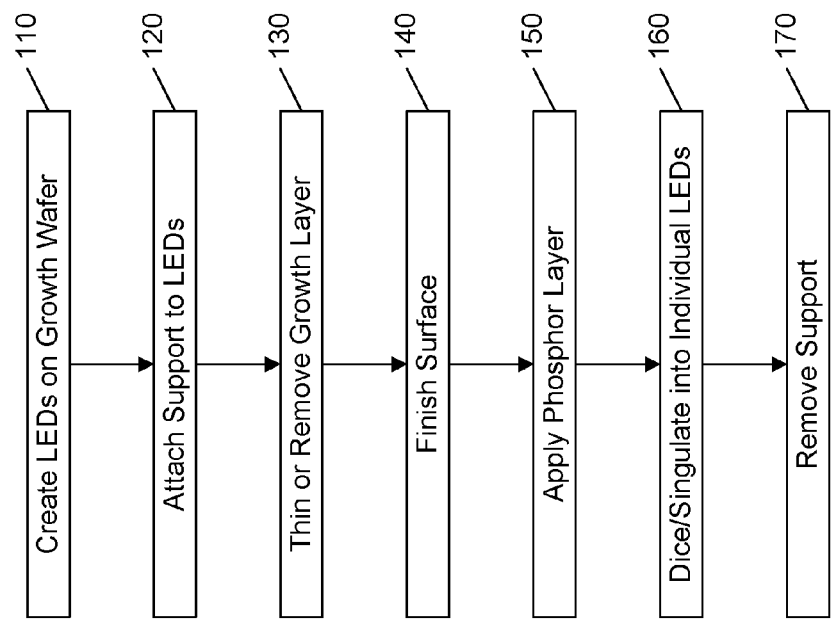
FIG. 1A [PRIOR ART]

LED THIN-FILM DEVICE PARTIAL SINGULATION PRIOR TO SUBSTRATE THINNING OR REMOVAL

CROSS-REFERENCE TO PRIOR APPLICATIONS

This application is the U.S. National Phase application under 35 U.S.C. §371 of International Application No. PCT/IB2013/052534, filed on Mar. 29, 2013, which claims the benefit of U.S. Patent Application No. 61/620,480, filed on Apr. 5, 2012. These applications are hereby incorporated by reference herein.

FIELD OF THE INVENTION

This invention relates to the field of semiconductor fabrication, and in particular to the singulation of thin-film light emitting device (LED) dies during a process that includes thinning or removal of the growth substrate.

BACKGROUND OF THE INVENTION

The use of solid state light emitting devices (LEDs) for conventional lighting applications, such as vehicle light bulbs, interior and exterior lighting, and so on, continues to increase, due primarily to their expected useful life, and their efficiency.

In a conventional fabrication process, light emitting devices may be formed/grown on a first growth substrate or wafer, covered with a second, typically thinner, substrate or support material, and then the growth substrate is thinned or removed, effectively transferring the wafer-formed light emitting devices onto the second support material for subsequent processing. This subsequent processing may include the application of protective or functional materials, such as phosphor-embedded silicone, and the eventual dicing, or singulation, of the light emitting structures into individual light emitting devices comprising one or more of these structures.

FIG. 1A illustrates an example flow diagram for a conventional fabrication of a thin-film LED device with a phosphor coating, and FIG. 1B illustrates the structures formed during the corresponding fabrication stages.

At 110, light emitting device structures (LED dies) 101 are formed on a substrate (growth layer) 102, using techniques common in the art, which generally include forming at least an n-type layer, an active layer, and a p-type layer, and other layers, on a sapphire substrate or any suitable substrate, for example, silicon, silicon carbide, GaN, and so on. In this example, the LED dies 101 are structured to emit light through the 'lower' surface (typically the n-type layer) that is attached to the growth layer 102, and to have connections/pads for receiving power at the 'upper' surface (to and through the p-type layer), opposite the growth layer 102.

At 120, a secondary support structure 103 is attached to the upper surface of the LED dies 101. This secondary support structure may be a relatively thick sacrificial layer of removable material, or a film of removable 'dicing tape' on a frame that serves to hold the LED dies in place after the LED dies 101 are singulated.

At 130, the growth layer 102 is thinned or removed, to reduce interference to the light that will be emitted from the LED dies 101. To further facilitate light extraction from the LED dies 101, the light emitting surface 104 is finished, at 140, typically by roughening the surface 104 to reduce internal reflections.

At 150, a phosphor coating 105 is applied to cause a wavelength conversion of some or all of the light emitted by the LED die 101. In this manner, light output of a desired color is produced by the combination of wavelengths produced by the LED-phosphor combination. Obviously, if the LED emits light of the desired color directly, there is no need for this phosphor coating 105. Other coatings, such as protective coatings may also be applied.

At 160, the LED dies 101 with coating 105 are 'diced', or 'singulated', to provide individual devices that may subsequently be mounted on structures that facilitate handling and connection to a lamp or other illumination device. This dicing may be performed by laser or saw, the laser typically being preferred for its thinner kerf width, allowing for improved area efficiency by minimizing the required space between devices.

At 170, the secondary support material 103 is removed, allowing access to the connections to the LED die 101 on the now 'lower' surface, opposite the phosphor coating 105. If connection to the LED die 101 does not require access to the lower surface, or if the support material 103 provides the connections to the LED die 101, the support material 103 may not be removed.

When the LED dies 101 are formed on the growth substrate 102, the growth process and the combination of different materials, typically having significantly different thermal expansion characteristics, introduce stress within and between the LED dies. Accordingly, the growth substrate is purposely selected to be substantially rigid to avoid distortions, such as bowing, due to this stress.

However, the secondary support 103 is generally not as rigid, and when the growth substrate 102 is removed, at 130, these stresses cause distortions in the structure of the LEDs on the secondary support 103. These distortions will introduce curvatures in the streets between the rows and columns of the LED dies 101 that are used for dicing the dies 101. Accordingly, either additional steps must be taken to counteract this distortion, or allowances for this distortion must be made in the spacing between the LED dies 101, decreasing the area efficiency.

The typical kerf width of a laser cut is about ten microns, and, in the case of non-thinned growth substrate, the typical street width to accommodate for this kerf width and manufacturing tolerances is about thirty microns. In a structure formed by a six inch wafer that is thinned or removed, however, the distortion introduced by the growth stresses may be greater than thirty microns. Accordingly, either the yield will be decreased as the LED dies are mistakenly cut, or, the street widths must be significantly increased, often by a factor of two or more.

Additionally, some lamp assembly processes rely on the outer edges of the LED die to provide optical alignment with the light emitting surface; if a die is offset from the nominal center line of the street due to the distortion, the optical alignment will be similarly offset.

SUMMARY OF THE INVENTION

It would be advantageous to improve the area efficiency of wafers formed for processes that include growth substrate thinning or removal. It would also be advantageous to increase the cutting accuracy in processes that include growth substrate thinning or removal To better address one or more of these concerns, in an embodiment of this invention, the LED dies are partially singulated while on the full depth growth substrate. Slots are made through the streets separating the LED dies, but not through the growth substrate, leaving the now separated LED dies on the growth substrate. A secondary support is attached to the LED dies on the opposite surface from the growth substrate, and the growth substrate is thinned or removed, leaving the LED dies on the secondary support. Because the LED dies are separated while on the full depth growth substrate, the likelihood of distortion is virtually eliminated, and the width of the streets between the LED dies may be correspondingly reduced.

BRIEF DESCRIPTION OF THE DRAWINGS

The invention is explained in further detail, and by way of example, with reference to the accompanying drawings wherein:

FIGS. 1A-1B illustrate an example flow diagram and corresponding structures for a conventional fabrication of light emitting devices with thinned or removed growth substrates.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Figure 2B:
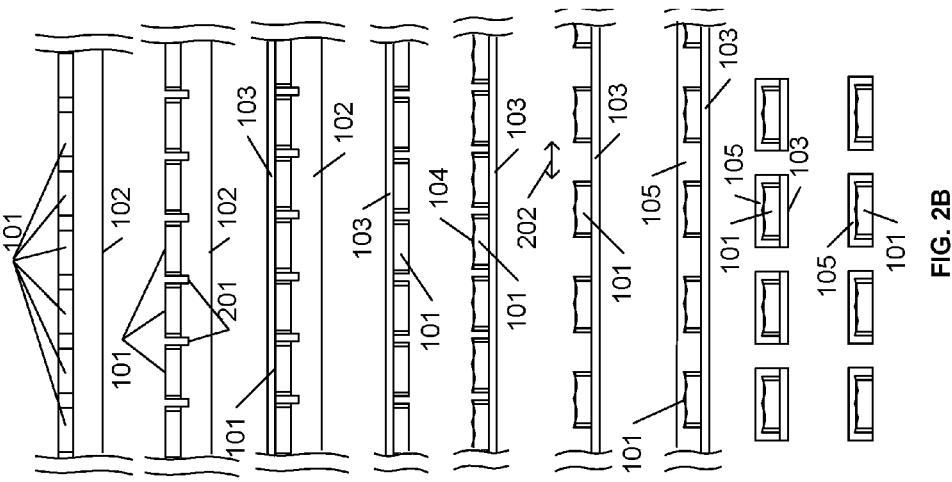
FIGS. 2A-2B illustrate an example flow diagram and corresponding structures for a fabrication of light emitting devices with thinned or removed growth substrates in accordance with aspects of this invention.
Figure 2A:
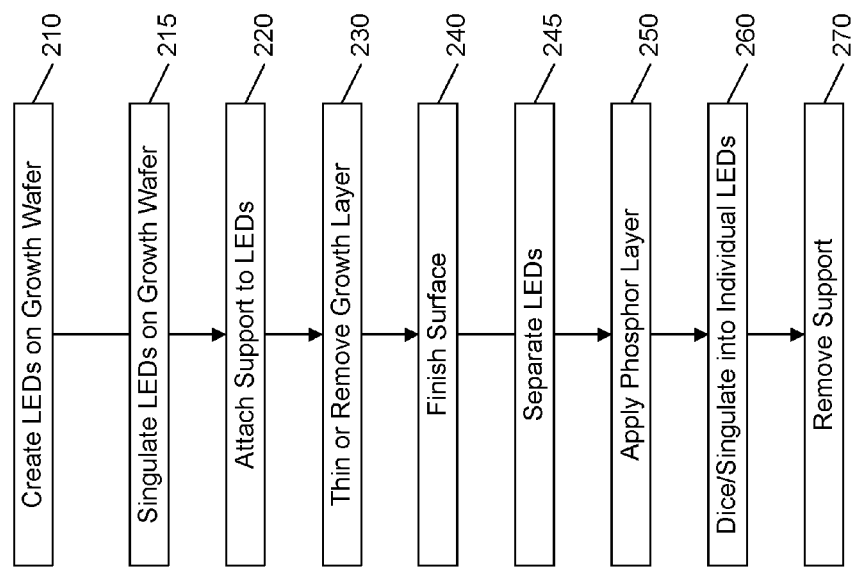

FIG. 2A illustrates an example flow diagram and FIG. 2B illustrates corresponding structures for a fabrication of light emitting devices with thinned or removed growth substrates in accordance with aspects of this invention.

At 210, the light emitting device (LED) dies 101 are formed on a substrate 102, similar to 110 in FIG. 1A. As in FIG. 1A, the LED dies 101 are structured to emit light through the 'lower' surface that is attached to the growth layer 102, and to have connections/pads for receiving power at the 'upper' surface, opposite the growth layer 102.

As noted above, the formation of the LED dies 101 introduces stress during the fabrication process, but the growth substrate 102 is designed/selected to be rigid enough to withstand the stress without distortion. Accordingly, the LED dies 101 will remain accurately situated on the growth layer 102 through the formation process.

Instead of singulating the LED dies 101 after completion of the remaining fabrication processes, as in the conventional process of FIG. 1A, in accordance with an aspect of this invention, the LED dies 101 are "partially-singulated" while on the full depth growth substrate 102, at 215, thereby allowing for precision cutting while the dies 101 are fixed on the rigid substrate 102. As illustrated in FIG. 2B, the slots, or scribe lines, 201 between the dies 101 extend through the streets between the dies 101, but do not completely penetrate through the substrate 102, thereby isolating the dies 101 from each other except through the substrate 102. These slots 201 are illustrated as having a rectangular profile, but other shapes may be formed, including slopes or curves, typically dependent upon the process or tool used to form these slots After partially singulating the LED dies 101 on the substrate 102, a secondary support 103 is attached to the LED dies 101 on an opposite surface from the growth substrate 102, at 220, similar to 120 in FIG. 1. In accordance with an aspect of this invention, the support 103 may be a stretchable dicing film/tape on a frame, the film including an adhesive for attaching the film to the surfaces of the LED dies 101. Alternatively, the support 103 may be a discrete rigid member, or an additional sacrificial layer formed on the LED dies 101.

The growth surface is thinned or removed, at 230, similar to the thinning or removal of 130 of FIG. 1A. However, as contrast to the thinning or removal of the conventional process, the prior isolation of the LED dies 101 on the substrate 102 at 215 relieves the stress between the LED dies 101, so that when the growth substrate is thinned or removed, the stress induced distortion is minimized. To enable separation of the LED dies 101 when the substrate 102 is thinned, rather than removed, the depth of the slots 201 extends below the thickness of the substrate 102 after thinning. Thus, the thinning step completes the singulation of the LED dies 101.

At 240, the light emitting surface 104 of the LED dies 101 is optionally finished to enhance the light extraction efficiency, typically by roughening the surface to reduce internal reflections, similar to 140 of FIG. 1A.

The invention is disclosed hereafter using the paradigm of a phosphor coated light emitting device, and, in particular with regard to a technique disclosed in copending U.S. patent application 61/612,427, "SINGULATION OF LIGHT EMITTING DEVICES BEFORE AND AFTER APPLICATION OF PHOSPHOROUS", filed Mar. 19, 2012 for Frank Wei, and incorporated by reference herein. One of skill in the art will recognize, however, that the principles presented herein are not limited to this example technique, as disclosed further below.

In accordance with aspects of this copending application, the LED dies 101 are placed on a stretchable film 103, such as a film of dicing tape mounted on a frame, at 230. At 245, this stretchable film is subsequently stretched to increase the space 202 between the singulated LED dies 101 on the film 103. This additional space 202 allows for the use of mechanical saws to singulate phosphor coated light emitting elements, avoiding the phosphor damage associated with laser cutting through phosphor, as the phosphor reacts to the laser light.

After increasing the space 202 between LED dies 101, the phosphor coating 105 is applied, at 250; and at 260, these phosphor 105 coated LED dies 101 are singulated, typically by mechanical sawing. This phosphor coating 105 may be applied as a paste-like compound that is cured over the LED dies 101, as a preformed sheet that is laminated over the LED dies 101, or in other forms of application, common in the art.

At 270, the support material 103 may be removed, to allow access to the electrical contacts to the light emitting device 101, similar to 170 of FIG. 1A.

As noted above, an embodiment of this invention need not be limited to the above described stretching-coating-cutting technique that is disclosed in the aforementioned copending application. For example, if a phosphor coating is not to be applied, or is to be applied after singulation, the LED dies 101 on the support 103 after the optional surface finishing at 240 may be singulated by merely removing the support 103.

If the growth substrate 102 has been thinned, rather than removed, the LED dies 101 will be attached via this thinned growth substrate if the depth of the slots 201 does not extend at least as deep as the remaining thinned substrate 102. If the LED dies 101 remain so attached, the LED dies are singulated by performing a second cut through this thinned substrate 102. However, because little if any distortion will have been introduced after the LED dies 101 are partially singulated on the full thickness substrate 102, this second cutting may be performed with high accuracy.

Also, although the film stretching process is particularly well suited for increasing the space 202 between the LED dies 101, at 245, and subsequently applying the phosphor layer 103, at 250, the phosphor layer 103 may be applied at 250 without the intermediate spacing process at 245.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein the dies are 'pre-processed' before application of the phosphor layer at 250 of FIG. 2A. For example, the light emitting dies may be tested before the application of phosphor, and only properly operating dies are subsequently processed. In such an embodiment, faulty light emitting dies may be removed from the secondary support 103 and replaced by operational light emitting dies, or by 'slugs' that are taller than the light emitting dies, the extra height preventing the application of phosphor in these areas. Alternatively all of the light emitting dies 101 may be removed from the support 103, the faulty dies discarded, and the non-faulty dies mounted on a new support 103 for further processing at 250.

In like manner, the testing of the light emitting dies 101 may include more than a merely fault/no-fault determination. For example, one or more of the principles presented in U.S.PA 2008/0157103, "Laminating Encapsulant Film Containing Phosphor Over LEDs", filed 17 Mar. 2008 for Haryanto Chandra, incorporated by reference herein, may be applied to optimize the performance of the combination of particular light emitting dies and phosphor coatings. In this copending application, the light emitting dies are tested and sorted ('binned') based on their light output characteristics. Thereafter, a particular phosphor composition is selected to be applied to each group of light emitting dies with similar characteristics so that the combination of the particular light emission of the light emitting dies and wavelength conversion of the selected phosphor provide a desired composite light output. By pairing a group of similarly performing light emitting dies with a phosphor composition that is selected based on the particular characteristics of the group, the variance of the composite light output is substantially reduced.

In such an embodiment, at 240 of FIG. 2A, the light emitting dies 101 may be tested, removed from the substrate 103, and stored in bins based on their determined light output characteristics. Thereafter, light emitting dies 101 from a given bin of similarly performing dies are situated on a new substrate 103, at 245, prior to the application of the phosphor layer 105, at 250. The phosphor layer 105 may be a paste compound having a particular combination of phosphor elements, or a preformed phosphor sheet that is selected based on its actual performance when coupled with the particular group of similarly performing light emitting dies.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A method comprising:
    forming light emitting device (LED) dies on a growth substrate, wherein streets lie between the LED dies and each LED die comprises pads for receiving power at a same surface opposite the substrate;
    forming slots through the streets without completely penetrating through the growth substrate; and,
    after forming the slots:
        attaching a flexible film to the LED dies on the surface opposite from the growth substrate, wherein flexible film covers the slots so the slots remain unfilled;
        while the LED dies are attached to the flexible film, thinning or removing the growth substrate;
        after said thinning or removing, stretching the flexible film to provide additional space between the LED dies and applying a wavelength conversion layer over the LED dies; and
        after said stretching, singulating the LED dies.

2. The method of claim 1, wherein the wavelength conversion layer is a preformed sheet of wavelength conversion material.

3. The method of claim 2, further comprising testing the LED dies and sorting the LED dies after singulation based on the testing.

4. The method of claim 3, including selecting the wavelength conversion layer material based on the testing of the LED dies.

5. The method of claim 1, wherein forming the slots includes laser cutting, and the singulating includes mechanical sawing.

6. The method of claim 1, wherein singulating the LED dies includes removing the flexible film from the LED dies.

7. The method of claim 1, including finishing a light emitting surface of the LED dies before singulating the LED dies.

8. The method of claim 1, wherein said applying comprises applying a phosphor coating over the LED dies, and said singulating comprises mechanical sawing.

9. The method of claim 8, further comprising, after said singulating, removing the flexible film from the LED dies.

* * * * *